(12) United States Patent
du Toit et al.

(10) Patent No.: US 6,864,757 B2
(45) Date of Patent: Mar. 8, 2005

(54) TUNABLE MICROWAVE DEVICES WITH AUTO-ADJUSTING MATCHING CIRCUIT

(75) Inventors: Cornelis Frederik du Toit, Ellicott City, MD (US); Deirdre A. Ryan, Poquoson, VA (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

(21) Appl. No.: 10/455,901

(22) Filed: Jun. 6, 2003

(65) Prior Publication Data

US 2003/0206077 A1 Nov. 6, 2003

Related U.S. Application Data

(62) Division of application No. 09/909,187, filed on Jul. 19, 2001, now Pat. No. 6,590,468.
(60) Provisional application No. 60/219,500, filed on Jul. 20, 2000.

(51) Int. Cl.[7] .................................................. H03H 7/38
(52) U.S. Cl. .......................... 333/34; 333/161; 333/238
(53) Field of Search .............................. 333/34, 33, 18, 333/161, 17.3, 238

(56) References Cited

U.S. PATENT DOCUMENTS

| | | |
|---|---|---|
| 5,032,805 A | 7/1991 | Elmer et al. |
| 5,212,463 A | 5/1993 | Babbitt et al. |
| 5,307,033 A | 4/1994 | Koscica et al. |
| 5,334,958 A | 8/1994 | Babbitt et al. |
| 5,409,889 A | 4/1995 | Das |
| 5,427,988 A | 6/1995 | Sengupta et al. |
| 5,430,417 A | 7/1995 | Martin et al. |
| 5,451,567 A | 9/1995 | Das |

(List continued on next page.)

FOREIGN PATENT DOCUMENTS

| | | |
|---|---|---|
| EP | 0909024 A2 | 4/1999 |
| JP | 10209722 | 8/1998 |

OTHER PUBLICATIONS

U.S. Appl. No. 09/594,837, filed Jun. 15, 2000, Chiu.

(List continued on next page.)

*Primary Examiner*—Stephen E. Jones
(74) *Attorney, Agent, or Firm*—Robert P. Lenart; Michael N. Haynes; Jame S. Finn

(57) ABSTRACT

An impedance matching circuit includes a conductor line having an input port and an output port, a ground conductor, a tunable dielectric material positioned between a first section of the conductor line and the ground conductor, a non-tunable dielectric material positioned between a second section of the conductor line and the ground conductor, and means for applying a DC voltage between the conductor line and the ground conductor. The impedance matching circuit may alternatively include a first planar ground conductor, a second planar ground conductor, a strip conductor having an input port and an output port, and positioned between the first and second planar ground conductors to define first and second gaps, the first gap being positioned between the strip conductor and the first planar ground conductor and the second gap being positioned between the strip conductor and the second planar ground conductor. A non-tunable dielectric material supports the first and second planar ground conductors and the strip conductor in the same plane. A connection is provided for applying a DC voltage between the strip conductor and the first and second planar ground conductors. A plurality of tunable dielectric layer sections are positioned between the strip conductor and the first and second planar ground conductors so as to bridge the gaps between the said first and second planar ground conductors and the strip conductor at a plurality of locations, leaving non-bridged sections in between, defining a plurality of alternating bridged and non-bridged co-planar waveguide sections.

26 Claims, 5 Drawing Sheets

U.S. PATENT DOCUMENTS

| | | | |
|---|---|---|---|
| 5,479,139 A | 12/1995 | Koscica et al. | |
| 5,496,795 A | 3/1996 | Das | |
| 5,502,372 A * | 3/1996 | Quan | 324/72.5 |
| 5,561,407 A | 10/1996 | Koscica et al. | |
| 5,635,433 A | 6/1997 | Sengupta | |
| 5,635,434 A | 6/1997 | Sengupta | |
| 5,679,624 A | 10/1997 | Das | |
| 5,689,219 A | 11/1997 | Piirainen | |
| 5,693,429 A | 12/1997 | Sengupta et al. | |
| 5,694,134 A | 12/1997 | Barnes | |
| 5,766,697 A | 6/1998 | Sengupta et al. | |
| 5,830,591 A | 11/1998 | Sengupta et al. | |
| 5,846,893 A | 12/1998 | Sengupta et al. | |
| 6,029,075 A | 2/2000 | Das | |
| 6,045,932 A * | 4/2000 | Jia et al. | 428/702 |
| 6,074,971 A | 6/2000 | Chiu et al. | |

OTHER PUBLICATIONS

U.S. Appl. No. 09/768,690, filed Jan. 24, 2001, Sengupta et al.

U.S. Appl. No. 09/882,605, filed Jun. 15, 2001, Sengupta.

U.S. Provisional application No. 60/295,046, filed Jun. 1, 2001, Chiu et al.

K. Kazuhisa, "Hybrid Integrated Circuit Device," *Patent Abstracts of Japan*, vol. 016, No. 097 (E–1176), Mar. 10, 1992 & JP 03 276901 A (Mitsubishi Electric Corp.), Dec. 9, 1991.

N. Eiji, "High–Frequency Circuit and Its Manufacture," *Patent Abstracts of Japan*, vol. 1998, No. 13, Nov. 30, 1998 & JP 10 209722 A (Seiko Epson Corp.), Aug. 7, 1998.

* cited by examiner

TUNABLE MICROWAVE DEVICES WITH AUTO-ADJUSTING MATCHING CIRCUIT

CROSS REFERENCE TO RELATED APPLICATION

This application is a divisional application of U.S. patent application Ser. No. 09/909,187, filed Jul. 19, 2001, that issued as U.S. Pat. No. 6,590,468 on Jul. 8, 2003, which claims the benefit of U.S. Provisional Application No. 60/219,500, filed Jul. 20, 2000.

FIELD OF THE INVENTION

The invention relates to the field of tunable microwave devices. More specifically, the invention relates to impedance matching circuits that utilize a bias voltage to alter the permittivity of a tunable dielectric material.

BACKGROUND OF THE INVENTION

Microwave devices typically include a plurality of components that may have different characteristic impedances. In order to propagate the microwave signal through the device with minimal loss, the impedances of the various components are matched to the characteristic impedance of the input and output signal. By transitioning the impedances so that an input transmission line is matched, most of the available power from the input is delivered to the device. Historically, impedance matching techniques have treated the matching of components with constant characteristic impedances to a constant characteristic impedance of the input line, e.g. to 50 Ω. Multi-stage matching circuits have been utilized to obtain minimal reflection loss over a specified frequency range of operation of a device. Numerous techniques, such as the use of radial stubs, quarter wave transformers, and multi-stage matching circuits with specific distributions, such as Binomial or Tchebychef, etc., have been developed in order to achieve maximum power transfer from the input to the device.

However, the characteristic impedance of the tunable components in tunable microwave devices is not a constant value. The characteristic impedance of the tunable component varies over the operating range of the device from a minimum to a maximum impedance value. In tunable dielectric devices, a bias voltage applied to tunable dielectric material provides the ability to alter the dielectric constant. The change in the dielectric constant provides a variation in the electrical path length of a microwave signal. As the electrical properties of the tunable dielectric material are varied, the characteristic impedance is also affected.

In practice, a single characteristic impedance within the tunable components minimum/maximum impedance range is selected. This single impedance value is matched using one of the state of the art impedance matching techniques. However, as the tunable microwave device is operated, the impedance of the tunable component varies from the matched impedance and a degradation in the impedance match occurs.

Prior tunable dielectric microwave transmission lines have utilized tuning stubs and quarter wave matching transformers to transition the impedance between the input and output. The technique is best for matching a fixed impedance mismatch. U.S. Pat. No. 5,479,139 by Koscica et al. discloses quarter wavelength transformers using non-tunable dielectric material for the purpose of impedance matching to a ferroelectric phase shifter device. Similar impedance matching configurations using non-tunable dielectric substrate of background interest are shown in U.S. Pat. No. 5,561,407, U.S. Pat. No. 5,334,958, and U.S. Pat. No. 5,212,463. The disadvantage of the above technique is that the impedance match is optimal at one selective tuning point of the device and degrades as the device is tuned through its range. Hence, the reflection loss due to impedance match increases when the device is tuned away from the matched point.

Another impedance matching approach for tunable devices is presented in U.S. Pat. No. 5,307,033 granted to Koscica et al. That patent discloses the use of spacing of a half wavelength between elements or matching networks for the purpose of impedance matching.

Still another approach utilizes quarter wavelength transformers on tunable dielectric material as disclosed in U.S. Pat. No. 5,032,805, granted to Elmer et al. Other impedance matching configurations are shown in U.S. Pat. Nos. 6,029,075; 5,679,624; 5,496,795; and 5,451,567. Since it is also desirable to reduce the insertion loss of the matching network, a disadvantage of the above approach is that the quarter wavelength transformer on tunable dielectric material increases the insertion loss.

The disclosures of all of the above-mentioned patents are expressly incorporated by reference.

It would be desirable to minimize the impedance mismatch in tunable microwave device applications. There is a need for a technique for improving impedance matching for tunable microwave components that achieves minimal reflection and insertion losses throughout the range of operation of tunable devices.

SUMMARY OF THE INVENTION

This invention provides an impedance matching circuit comprising a conductive line having an input port and an output port, a ground conductor, a tunable dielectric material positioned between a first section of the conductive line and the ground conductor, a non-tunable dielectric material positioned between a second section of the conductor line and the ground conductor, and means for applying a DC voltage between the conductive line and the ground conductor.

The invention further encompasses an impedance matching circuit comprising a first ground conductor, a second ground conductor, a strip conductor having an input port and an output port. The strip conductor is positioned between the first and second ground conductors and to define first and second gaps, the first gap being positioned between the strip conductor and the first ground conductor and the second gap being positioned between the strip conductor and the second ground conductor. A non-tunable dielectric material supports the first and second ground conductors and the strip conductor in a plane. A connection point is provided for applying a DC voltage between the strip conductor and the first and second ground conductors. A plurality of tunable dielectric layer sections are positioned between the strip conductor and the first and second ground conductors so as to bridge the gaps between the first and second ground conductors and the strip conductor at a plurality of locations, leaving non-bridged sections in between, defining a plurality of alternating bridged and non-bridged co-planar waveguide sections.

The matching circuits form tunable impedance transformers that are able to match a constant microwave source impedance connected at the input port to a varying load impedance connected at the output port, thereby reducing signal reflections between the microwave source and a variable load impedance.

This invention provides an impedance matching circuit capable of matching a range of impedance values to a tunable microwave device in order to reduce reflections from impedance mismatch during tuning of the microwave device.

DESCRIPTION OF THE PREFERRED EMBODIMENTS

The preferred embodiments described herein are each designed for use within a certain arbitrary frequency range. For this reason all references to a "wavelength" will refer to the center frequency of the design.

Figure 1:
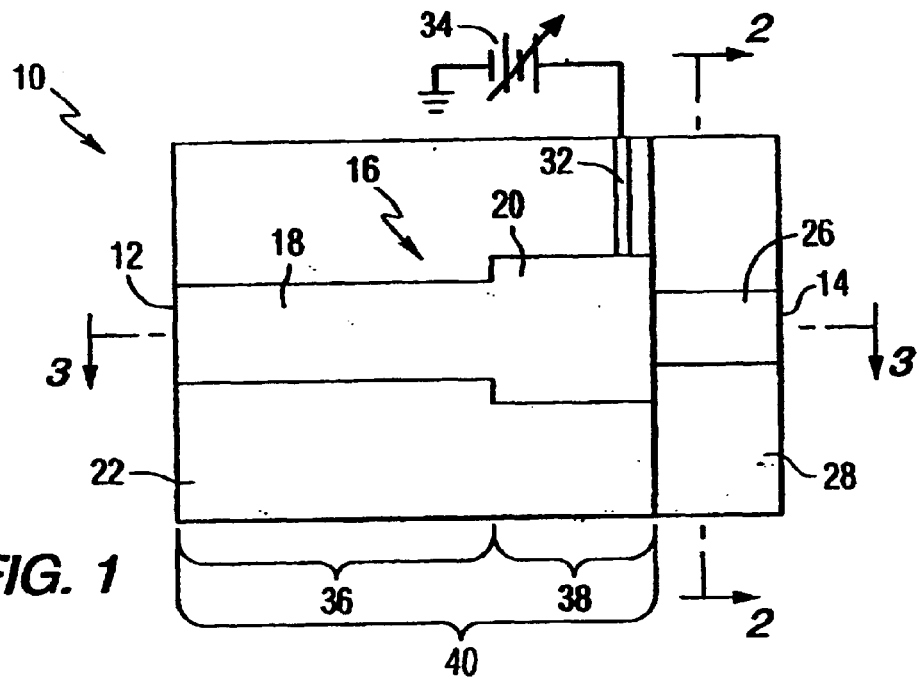
FIG. 1 is a plan view of a first embodiment of the auto adjusting matching network of this invention in the form of the microstrip.
Figure 2:
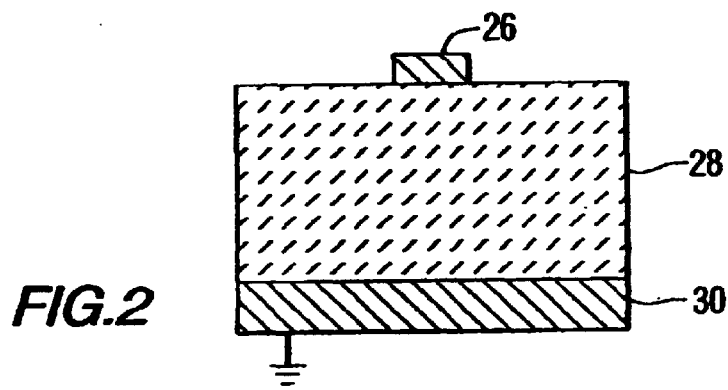
FIG. 2 is a cross-sectional view of the embodiment of FIG. 1 taken along line 2—2, showing a microstrip line geometry.
Figure 3:
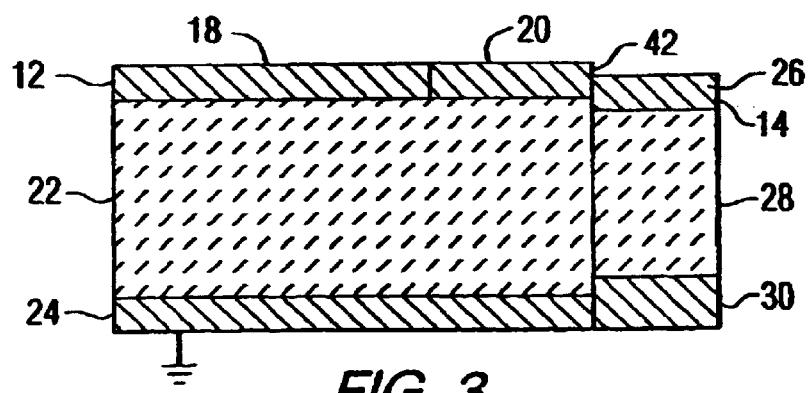
FIG. 3 is a cross-sectional view of the embodiment of FIG. 1 taken along line 3—3, showing a microstrip line geometry.

Referring to the drawings, FIG. 1 is a plan view of a first embodiment of an auto adjusting matching network of this invention in the form of the microstrip circuit 10. FIG. 2 is a cross-sectional view of FIG. 1 taken along line 2—2, showing the microstrip line geometry. FIG. 3 is a cross-sectional view of FIG. 1 taken along line 3—3.

The device has two ports 12 and 14 for input and output of a guided electromagnetic wave. It includes a multi-stage microstrip line 16, having sections 18 and 20 of various widths and lengths, deposited on a non-tunable dielectric substrate 22, which in turn is supported by ground plane 24; and a microstrip line section 26 deposited on a voltage tunable dielectric substrate 28 which in turn is supported by ground plane 30. A biasing electrode 32 in the form of a high impedance microstrip line is connected to microstrip section 20.

The biasing electrode 32 serves as a means for connecting an external variable DC bias voltage supply 34 to the auto-adjusting impedance matching circuit. The connection of the biasing electrode 32 to the circuit is not limited to microstrip section 20, but may be made to any other part of the circuit that is electrically connected to microstrip line section 26. Ground planes 24 and 30 are electrically connected to each other. While ground planes 24 and 30 are shown as separate elements, it should be understood that they may alternatively be constructed as a single ground plane.

The microstrip line section 26, which comprises a conducting strip, is directly supported by a dielectric layer 28, which is the voltage tunable layer. A ground plane 30 supports the dielectric layer 28. The microstrip line 26 is less than a quarter wavelength long and forms an approximately quarter wavelength long transformer when joined to section 20 of the matching network on the non-tunable dielectric substrate 22.

The non-tunable stages 36 and 38 of the matching network 10 form a multi-stage matching circuit 40 directly supported by the non-tunable dielectric layer 22. The multi-stage matching circuit 40 can be any number of stages of varying widths and lengths, not limited to quarter wavelength sections. If the non-tunable and tunable substrates 22 and 28 respectively are not of the same height, the last stage 38 of the matching network, which abuts the tunable dielectric 28, would be electrically connected to microstrip line section 26 via a step 42.

Figure 4:
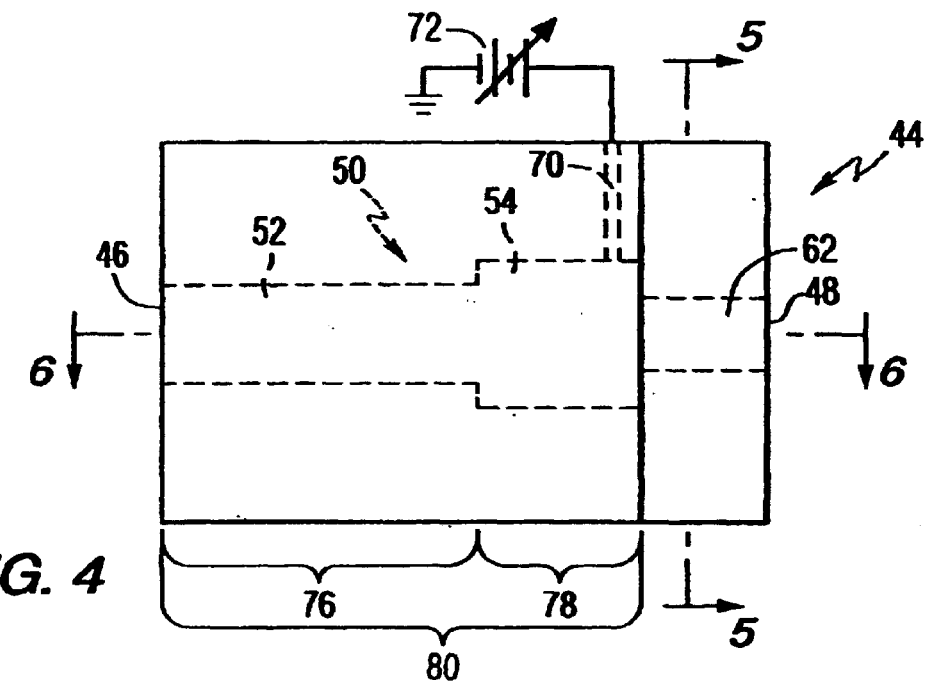
FIG. 4 is a plan view of a second embodiment of the auto adjusting matching network of this invention in the form of the stripline.
Figure 5:
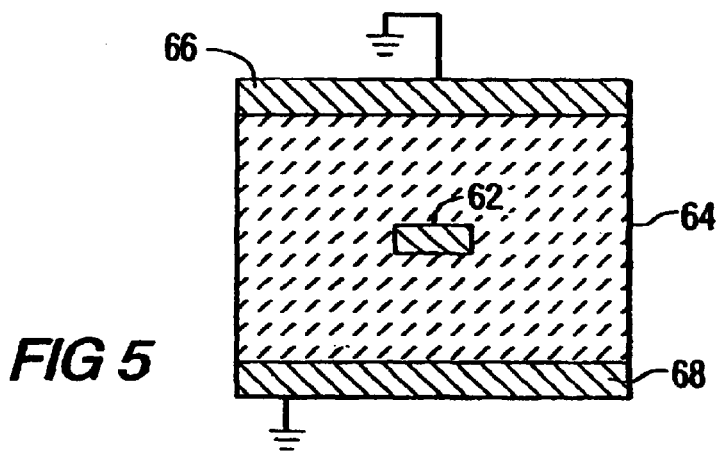
FIG. 5 is a cross-sectional view of the embodiment of FIG. 4 taken along line 5—5, showing a stripline geometry.
Figure 6:
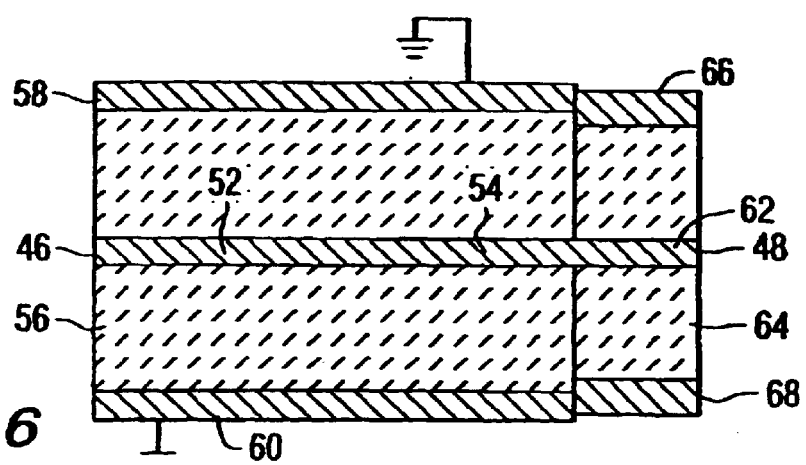
FIG. 6 is a cross-sectional view of the embodiment of FIG. 4 taken along line 6—6, showing a stripline geometry.

FIG. 4 is a plan view of a second embodiment of the auto adjusting matching network 44 of the invention in the form of a stripline. FIG. 5 is a cross-sectional view of FIG. 4 taken along line 5—5, showing a stripline geometry. FIG. 6 is a cross-sectional view of FIG. 4 taken along line 6—6.

The device 44 has two ports 46 and 48 for input and output of the guided electromagnetic wave. It comprises a stripline 50 having sections 52 and 54 of various widths and lengths embedded in a non-tunable dielectric substrate 56 supported by top and bottom ground planes 58 and 60, an additional section 62 of stripline 50 embedded in a tunable dielectric substrate 64 supported by top and bottom ground planes 66 and 68, and a biasing electrode 70 in the form of a high impedance stripline is connected to stripline section 54.

The connection of biasing electrode 70 to the circuit is not limited to stripline section 54, but may be made to any other part of the circuit that is electrically connected to stripline section 62. The biasing electrode 70 serves as means for connecting the auto-adjusting impedance matching circuit to an external adjustable DC voltage bias source 72. Ground planes 66 and 68 may or may not be the same ground planes as for the tunable microwave device to which the matching circuit is connected. Ground planes 66 and 68 are electrically connected to the ground planes of the tunable microwave device. Ground planes 66 and 68 are electrically connected to ground planes 58 and 60.

The stripline section 62, which is a conducting strip, is directly embedded in the tunable dielectric layer 64, which is the voltage tunable layer. Ground planes 66 on the top and 68 on the bottom support the dielectric layer 64. The stripline 62 is less than a quarter wavelength long and forms an approximate quarter wavelength long transformer when joined to section 54 of the matching network in the non-tunable dielectric substrate 56.

The non-tunable stages 76 and 78 of the matching network 44 form a multi-stage matching circuit 80 directly supported by the non-tunable dielectric layer 56. The multi-stage matching circuit 80 can be any number of stages of varying widths and lengths, not limited to and including quarter wavelength sections. The last stage 78 of the matching network, which abuts the tunable dielectric 64, is electrically connected to microstrip line section 62.

Figure 7:
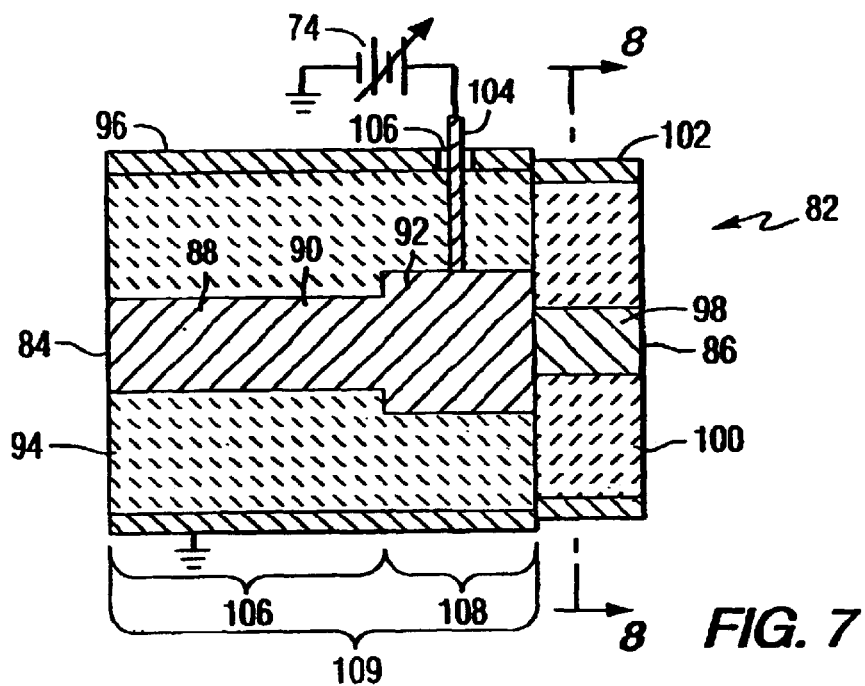
FIG. 7 is a cross-sectional view of a third embodiment for the auto adjusting matching network of this invention based on a coaxial geometry.
Figure 8:
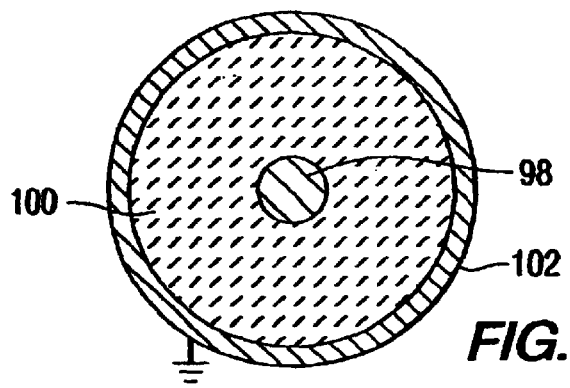
FIG. 8 is a cross-sectional view of the embodiment of FIG. 7 taken along line 8—8, showing the coaxial transmission line geometry.

FIG. 7 is a longitudinal cross-sectional view of a third embodiment of the invention for the auto adjusting matching network based on a coaxial geometry. FIG. 8 is a cross-sectional view of FIG. 7 taken along line 8—8, showing the coaxial transmission line geometry.

The device 82 of FIGS. 7 and 8 has two ports 84 and 86 for input and output of the guided electromagnetic wave. It comprises a center conductor 88 having sections 90 and 92 of various diameters and lengths surrounded by a non-tunable dielectric substrate 94, which in turn is surrounded by ground conductor 96. An additional center conductor section 98 is surrounded by a tunable dielectric substrate 100, which in turn is surrounded by ground conductor 102. A thin biasing electrode 104 enters the co-axial structure through a small hole 106 and is connected to the central conductor 88.

The connection of biasing electrode 104 to the circuit is not limited to the center conductor section 92, but may be made to any other part of the circuit that is electrically connected to center conductor section 98. The biasing electrode 104 serves as a means for connecting an external adjustable DC voltage bias source 74 to the auto-adjusting impedance matching circuit. Ground conductor 102 may or may not be the same ground conductor as for a tunable microwave device to which the matching circuit would be connected. Ground conductor 102 is electrically connected to the ground conductor of the tunable microwave device. Ground conductors 96 and 102 are electrically connected to each other.

The center conductor section 98 is surrounded by a dielectric layer 100, which is the voltage tunable layer. The voltage tunable dielectric layer 100 is enclosed by a ground conductor 102. The center conductor section 98 is less than a quarter wavelength long and forms a composite impedance transformer approximately a quarter wavelength long when joined to section 92 of the matching network in the non-tunable dielectric 94.

The matching network 109 is a multi-stage matching circuit surrounded by a dielectric layer 94, which is a non-tunable dielectric. The dielectric layer 94 is enclosed by a ground conductor 96. The multi-stage matching circuit can be any number of stages of varying widths and lengths, not limited to and including quarter wavelength sections. The last stage 108 of the matching circuit, which abuts the tunable dielectric 100, is electrically connected to the center conductor 98.

Figure 9:
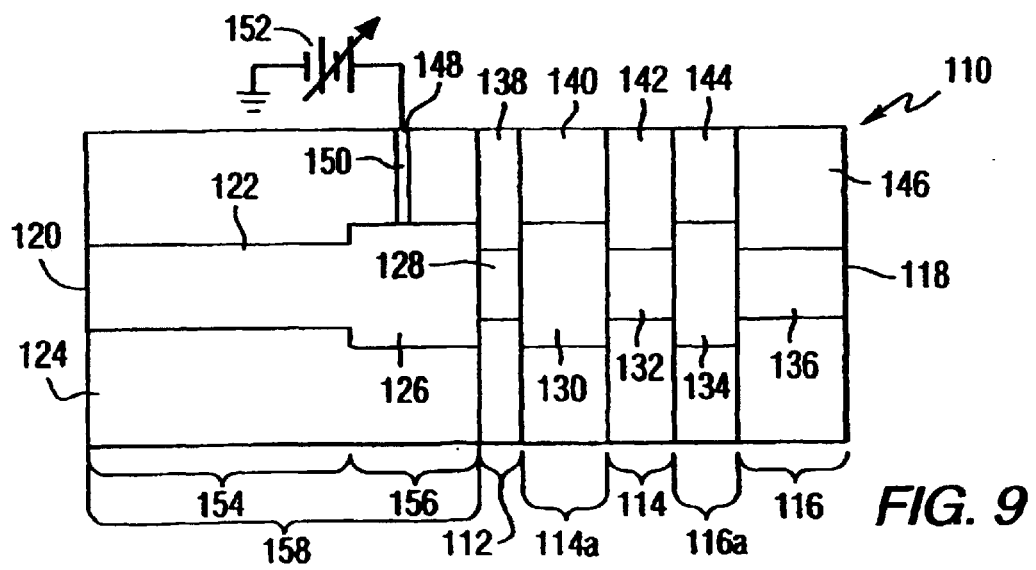
FIG. 9 is a plan view of another embodiment for the auto adjusting matching network of this invention including multiple partial stages on tunable material.

An extension to the first embodiment is shown in FIG. 9, as a matching circuit having multiple tunable stages 112, 114, 116, and multiple non-tunable stages 154, 156, 114a and 116a. The device has two ports 118 and 120 for input and output of a guided electromagnetic wave. It includes a matching microstrip line section 122, deposited on a non-tunable dielectric substrate 124; multiple pairs of microstrip sections 126, 128 and 130, 132 and 134, 136 deposited on pairs of non-tunable and tunable dielectric substrates 124, 138 and 140, 142 and 144, 146 respectively; a biasing electrode 148 in the form of a high impedance microstrip line connected to microstrip section 126; and a ground plane (not shown). The dielectric substrates are supported by the ground plane, which may include different electrically connected sections to adapt to the different thicknesses of the substrates 124, 140 144 and 138, 142, 146.

The connection of biasing electrode 148 to the circuit is not limited to microstrip section 126, but may be made to any other part of the circuit that is electrically connected to microstrip line sections 128, 132 and 136. The biasing electrode 148 connects the auto-adjusting impedance matching circuit to an adjustable DC voltage bias source 152. The ground plane may or may not be the same ground plane as for the tunable microwave device to which the matching circuit is connected.

Each of the microstrip line sections 128, 132 and 136 is less than a quarter wavelength long and forms an approximately quarter wavelength long impedance transformer when joined to microstrip sections 126, 130 and 134 respectively.

The non-tunable stages of the matching network 154, 156 form a multi-stage matching circuit 158 directly supported by the non-tunable dielectric layer 124. The multi-stage matching circuit can be any number of stages of varying widths and lengths, not limited to quarter wavelength sections. Microstrip section 126 of the last stage 156 of the non-tuning part of the matching network, which abuts the tunable stage 112, is electrically connected to microstrip line section 128. The latter abuts non-tunable tunable stage 114a and is electrically connected to microstrip line section 130. The latter abuts tunable stage 114 and is electrically connected to microstrip line section 132. The latter abuts non-tunable tunable stage 134 and is electrically connected to microstrip line section 134. The latter abuts tunable stage 116 and is electrically connected to microstrip line section 136.

The multiple stage pairs in FIG. 9 ensure impedance matching over a wider frequency and impedance range than the more simple geometry of FIG. 1. It should be understood that a similar extension to multiple stage pairs can be made for the second (stripline) and third (co-axial) embodiments as well.

Figure 10:
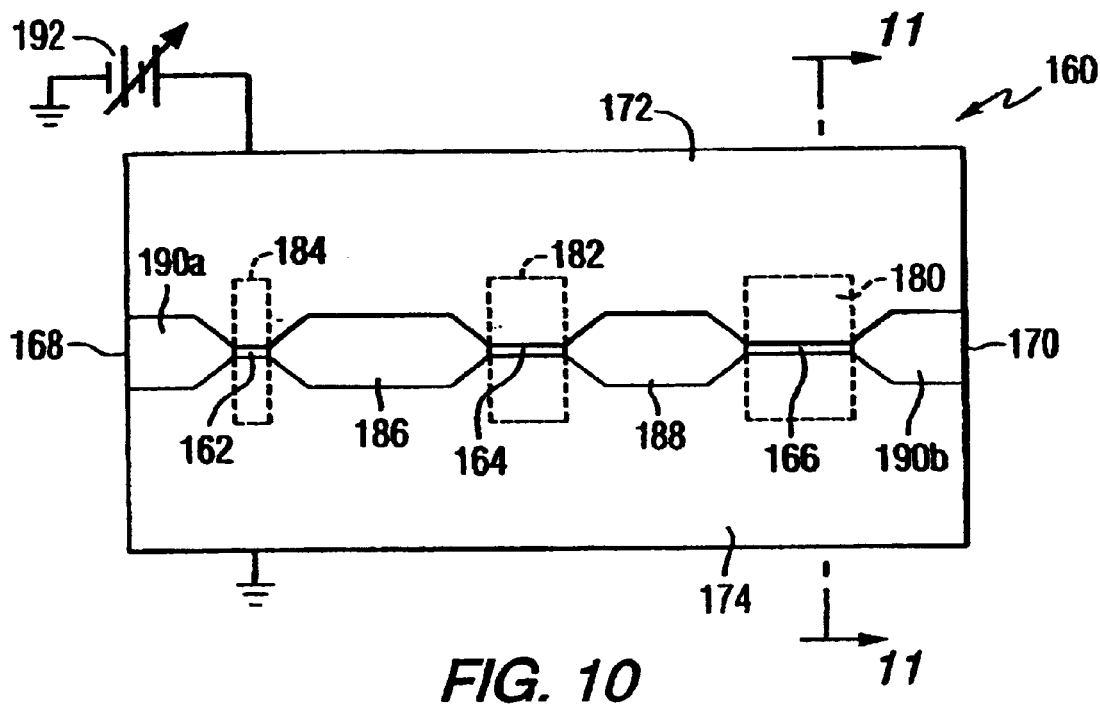
FIG. 10 is a plan view of another embodiment for the auto adjusting matching network of this invention based on a slotline or finline geometry, and including multiple partial stages.
Figure 11:
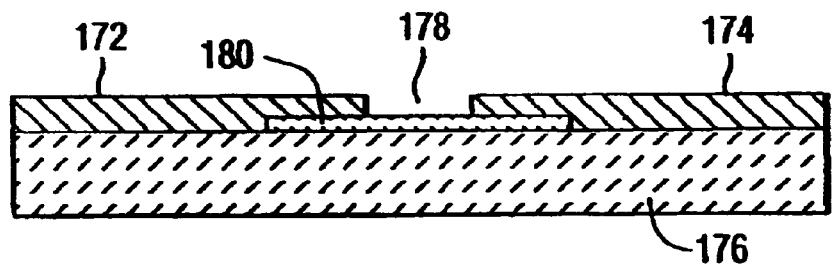
FIG. 11 is a cross-sectional view of the embodiment of FIG. 10 taken along line 11—11, showing a slotline geometry.

FIG. 10 is a plan view of another embodiment for the auto adjusting matching network 160 based on a slotline or finline geometry, and including multiple partial stages 162, 164, and 166. FIG. 11 is a cross-sectional view of FIG. 10 taken along line 11—11, showing a slotline geometry.

The device 160 has two ports 168 and 170 for input and output of the guided electromagnetic wave. It includes two conducting coplanar conductors 172 and 174, supported by non-tunable dielectric layer 176, and separated by a gap 178 to form a slotline (or finline if integrated into a waveguide) geometry. For comparison with the first, second and third embodiments, one of these coplanar conductors 174 can be considered to be the ground conductor. The slot 178 may be of uniform width, or it can be of non-uniform width as shown in FIG. 10. At multiple locations (three shown in FIG. 10) 162, 164 and 166, the slot is bridged by a tunable dielectric layer 180, 182 and 184, which can be deposited on the supporting dielectric layer 176 using thick or thin film technology prior to depositing the metal layers 172 and 174 on the supporting dielectric layer 176. Between locations 162, 164 and 166, there remain sections 186 and 188 as well as 190a and 190b, which are not bridged with a tunable material layer. Planar conductor 172 is connected to an adjustable DC voltage bias source 192, and planar conductor 174 is connected to DC ground. The coplanar conductors may or may not be the same coplanar conductors as for the tunable microwave device to which the matching circuit is connected.

Each of the tunable slotline sections 162, 164 and 166 is less than a quarter wavelength long, but together with the non-tunable intermediate sections 186, 188, 190a and 190b which are also typically shorter than a quarter wavelength long, these cascaded slotline sections form a cascaded network that may be a multiple of quarter wavelengths long. The network can be made longer by simply adding more pairs of tunable and non-tunable slotline sections. By careful choice of the relative lengths of each tunable and non-tunable slotline section, the cascaded network forms a tunable impedance matching network over a wide frequency band.

The slotline sections 186, 188 190a and 190b may also be bridged by a tunable layer, similar to the tunable sections 162, 164 and 166, but which may be less tunable. Reduced tunability in regions 186, 188 190a and 190b can be achieved by using a material that is less tunable and/or by using wider slot gaps to reduce the bias field strength in these regions. Instead of using different types of materials in the strongly tunable and lesser tunable slot regions, a tunable material can be deposited which may have varying tunability along the slot length.

Figure 12:
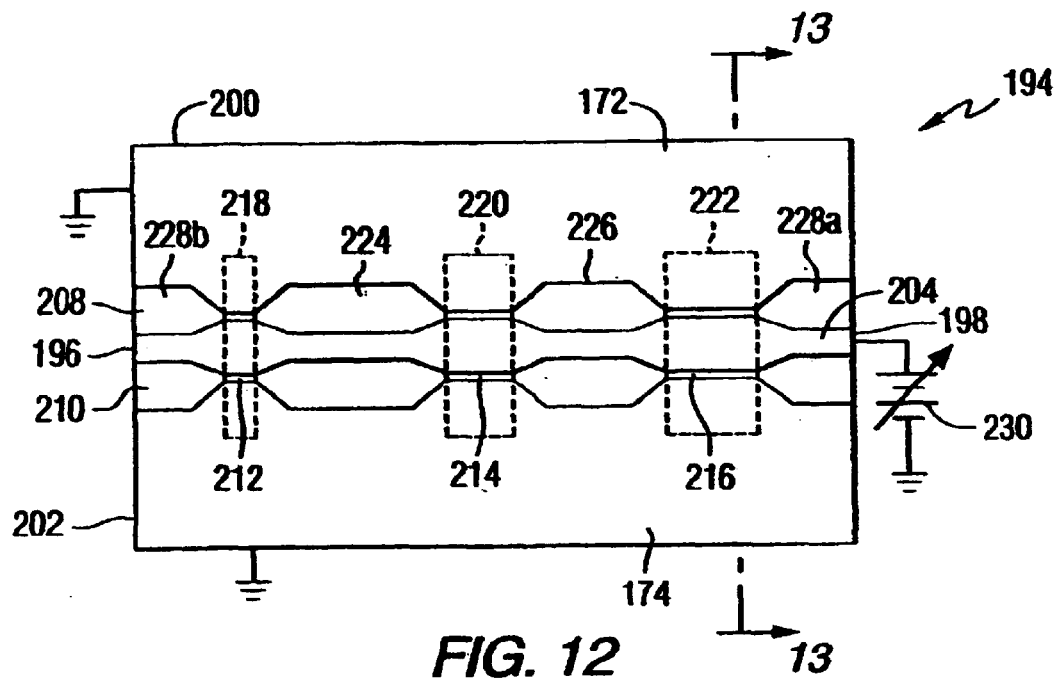
FIG. 12 is a plan view of another embodiment for the auto adjusting matching network of this invention based on a co-planar waveguide geometry, and including multiple partial stages.
Figure 13:
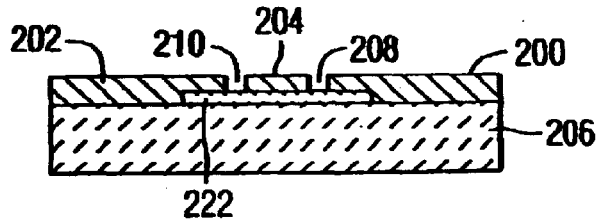
FIG. 13 is a cross-sectional view of the embodiment of FIG. 12 taken along line 13—13, showing a coplanar waveguide geometry.

FIG. 12 is a plan view of another embodiment for the auto adjusting matching network 194 based on a co-planar waveguide geometry, and including multiple partial stages. FIG. 13 is a cross-sectional view taken along line 13—13 in FIG. 12, showing a coplanar waveguide geometry.

The device 194 has two ports 196 and 198 for input and output of the guided electromagnetic wave. It includes two coplanar conducting ground conductors 200, 202 and a central strip conductor 204, supported by non-tunable dielectric layer 206, and separated by gaps 208 and 210 to form a co-planar waveguide geometry. The slots 208 and 210 may be of uniform width, or they can be of non-uniform width as shown in FIG. 12. At multiple locations 212, 214 and 216, the slots 208 and 210 are bridged by a tunable dielectric layers 218 220 and 222, which can be deposited on the supporting dielectric layer 206 using thick or thin film technology prior to depositing the metal layers 200 and 202 and 204 on the supporting dielectric layer 206. Between locations 212, 214 and 216, there remain sections 224, 226 as well as 228a and 228b, which are not bridged with a tunable material layer. Strip conductor 204 is connected to an adjustable DC voltage bias source 230, and planar ground conductors 200 and 202 are connected to DC ground. The coplanar conductors 200 and 202 and strip 204 may or may not be the same coplanar conductors as for the tunable microwave device to which the matching circuit is connected.

Each of the tunable co-planar waveguide sections 212, 214 and 216 is less than a quarter wavelength long, but together with the non-tunable intermediate sections 224, 226, 228a and 228b, which are also typically shorter than a quarter wavelength long, these cascaded co-planar waveguide sections form a cascaded network that may be a multiple of quarter wavelengths long. The network can be made longer by simply adding more pairs of tunable and non-tunable co-planar waveguide sections. By careful choice of the relative lengths of each tunable and non-tunable section, the cascaded network forms a tunable impedance matching network over a wide frequency band.

The slots in co-planar waveguide sections 224, 226, 228a and 228b may also be bridged by a tunable layer, similar to the tunable sections 212, 214 and 216, but in that case the layer may be less tunable. Reduced tunability in regions 224, 226, 228a and 228b can be achieved by using a material that is less tunable and/or by using wider slot gaps to reduce the bias field strength in these regions. Instead of using different types of materials in the strongly tunable and lesser tunable slot regions, a tunable material can be deposited which may have varying tunability along the co-planar waveguide length.

Figure 14:
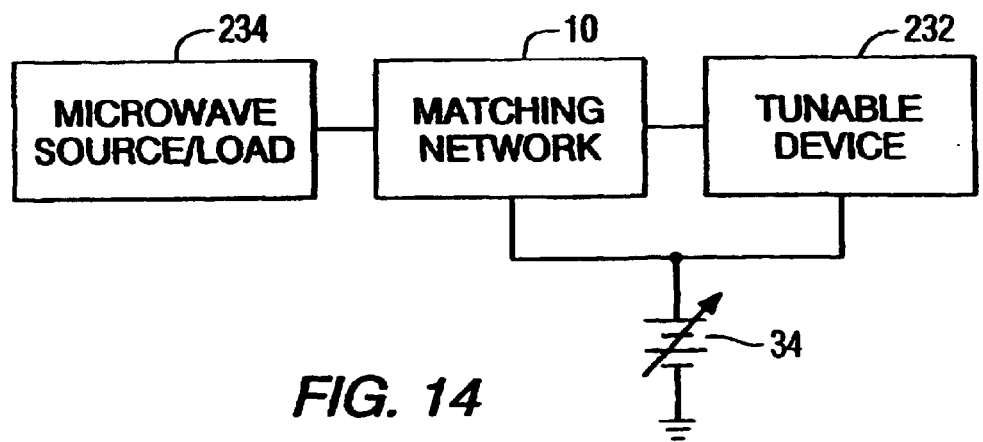
FIG. 14 is a block diagram showing a matching network of this invention coupled to a tunable dielectric device.

FIG. 14 is a block diagram showing a matching network 10 constructed in accordance with this invention coupled to a tunable microwave device 232. The tunable microwave device 232 could be one of many devices which have varying input/output characteristic impedances such as tunable phase shifters, delay lines, filters, etc. In the arrangement shown in FIG. 14, the adjustable external DC voltage source is used to supply bias voltage to the matching network 10 and the tunable microwave device 232 in tandem. As the voltage supplied by the external DC voltage source changes, the characteristic input/output impedance of the tunable dielectric device will also change. At the same time the impedance characteristics of the matching network will change to maximize power transfer from/to the microwave source/load 234 to/from the tunable microwave device 232. Alternatively, the tunable microwave device 232 and the matching network 10 can be controlled by two different external DC voltage sources.

The first preferred embodiment of the auto adjusting matching network uses a microstrip geometry. The second preferred embodiment of the auto-adjusting matching circuit has a stripline geometry, the third has a coaxial geometry, the fourth has a slotline or finline geometry and the fifth has a co-planar waveguide geometry.

In some embodiments, this invention provides a multi-stage impedance circuit functionally interposed between a conductor line and an entry point of a tunable microwave device, wherein the multi-stage impedance matching circuit reduces the signal reflection of a microwave signal propagating through the tunable impedance transformer into the microwave device, by matching the wave impedance of a microwave signal at the entry point, to the microwave source impedance.

This invention provides electrically controlled auto-adjusting matching networks that contribute to the tunable applications of microwave devices, while improving upon the range of operation of such devices. It overcomes the problem of matching to a microwave transmission line with a varying characteristic impedance. It is well suitable for tunable phase shifters, delay lines, and impedance matching for power amplifiers used as general-purpose microwave components in a variety of applications such as handset power amplifiers, radar, microwave instrumentation and measurement systems and radio frequency phased array antennas. The devices are applicable over a wide frequency range, from 500 MHz to 40 GHz.

The invention provides an impedance matching circuit having minimal reflection loss and reduced insertion loss over the tuning range of the device.

The auto-adjusting matching circuits of this invention may have a dual function. The main objective of the auto-adjusting matching circuit is to operate as an impedance matching network. Additionally, the auto-adjusting matching circuit has the ability to contribute to the tunable range of the microwave device to which it is coupled. Hence, the auto-adjusting matching circuit may incorporate tunable applications in its design as well. For example, the length of a tunable phase shifter may be decreased since the matching network provides a small amount of tunable phase shift through its operating range. Thus, both objectives also lead to a decrease in the insertion loss.

The present invention is advantageous because it has wide application to tunable microwave transmission line applications that make use of a static electric field to produce the desired tuning effect. This invention is also applicable to tunable microwave device applications that operate over a frequency band or at a single frequency.

The auto-adjusting matching circuit according to the present invention may or may not contribute to the design criteria of the tunable application and may use a common DC Voltage bias or a different DC Voltage bias. The invention minimizes reflection loss and increases the useable bandwidth of the microwave application.

The auto-adjusting matching circuit is a multi-stage impedance matching circuit that includes both non-tunable and tunable dielectric material. For example in one preferred embodiment, the impedance matching transformer stage supported by the tunable dielectric material is less than a quarter wavelength long and is connected to the adjacent transformer supported by the non-tunable dielectric to form a composite quarter wavelength impedance transformer. Individual sections of such a composite quarter wave transformer can be referred to as "partial stages". The matching transformers are tuned in tandem with the microwave device, in order to obtain low insertion loss as well as reducing the reflections from impedance mismatch. Thus, minimal insertion loss in the matching network is achieved. Additionally, the reflections from impedance mismatch due to the tuning of the microwave device are also minimized.

The auto-adjusting matching circuit is a two-port device, which in its simplest form includes a conducting matching network supported by a low-loss, conventional non-tunable dielectric substrate which in turn is a supported by a first ground conductor; at least one conducting partial-stage supported by a low-loss voltage-tunable dielectric layer, which in turn is supported by a second ground conductor; and a biasing electrode for connection to an external variable DC voltage source, preferably by way of a microwave choke.

The partial-stage on the tunable dielectric layer and the adjoining partial stage on the non-tunable dielectric layer together can form an approximate quarter wavelength long impedance transformer. The port leading to the partial stage supported by the tunable dielectric can be connected at the input or output of a tunable microwave device. The other port of the auto-adjusting matching circuit, which is connected to the matching section supported by the non-tunable dielectric substrate, forms a microwave signal input/output port, which has a substantially constant characteristic impedance.

The low-loss voltage-tunable dielectric layer of the partial-stage of the matching circuit may be comprised of the same tunable dielectric material as the tunable microwave device to which it is connected, or it may be comprised of a different tunable dielectric material. The auto-adjusting matching circuit may be biased with the same bias voltage as the tunable microwave device to which it is connected, or it may have a separate bias voltage applied. If more than one tunable material is used, i.e. one tunable dielectric material for the microwave tunable device and another for the partial-stage of the matching circuit, each may have its own separate bias voltage source or use a common (shared) bias voltage source.

As is well known, the bandwidth of the impedance matching network may be improved by additional matching stages. The additional matching stages may each be comprised of a partial stage supported by a tunable dielectric substrate in series with a partial stage supported by a non-tunable dielectric substrate. The tunable dielectric substrate sections for the additional matching stages may be comprised of the same tunable dielectric material as the first tunable partial-stage, or it may be comprised of a different tunable dielectric material.

The microwave matching section, which is supported by the tunable dielectric substrate for the dual purpose of reducing signal reflections and providing good transmission to and from the microwave transmission line application as well as contributing to the tunability of the application, may be a partial stage less than a quarter wave length long, or may include more than one matching section and is not limited to the use of one tunable dielectric substrate.

The biasing electrode may be connected to the auto-adjusting matching circuit by way of a microwave choke such as a high impedance transmission line, or by a highly inductive wire attached directly to the auto-adjusting matching circuit at any point that is ultimately electrically connected to the partial stage supported by the tunable dielectric.

The first and second ground conductors are electrically connected and if both are of a planar construction, they should preferably form one continuous ground plane. The non-tunable matching stages are electrically connected to the tunable partial-stage.

The objective of a matching network is to ensure that a guided electromagnetic wave entering one port (as such defined as the input port) will enter the microwave device and leave it at the other port (output), with minimum residual reflections at each port. The ground plane is kept at zero voltage, while a voltage bias is applied to the electrodes. The voltage bias causes a DC electric field across the voltage tunable dielectric, which affects the dielectric permittivity of the medium. Since the characteristic impedance of the microstrip is inversely proportional to the square root of the effective dielectric permittivity of the medium around the strip, the biasing voltage can be used to control the characteristic impedance of the auto-adjusting matching network. In this way, the characteristic impedance of the invention can be controlled by the voltage bias. The advantages of this invention are low insertion loss and improved bandwidth operation for tunable devices.

Tunable dielectric materials have been described in several patents. Barium strontium titanate ($BaTiO_3$—$SrTiO_3$), also referred to as BSTO, is used for its high dielectric constant (200–6,000) and large change in dielectric constant with applied voltage (25–75 percent with a field of 2 Volts/micron). Tunable dielectric materials including barium strontium titanate are disclosed in U.S. Pat. No. 5,427,988 by Sengupta, et al. entitled "Ceramic Ferroelectric Composite Material-BSTO-MgO"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO-ZnO"; U.S. Pat. No. 6,074,971 by Chiu et al. entitled "Ceramic Ferroelectric Composite Materials with Enhanced Electronic Properties BSTO-Mg Based Compound-Rare Earth Oxide". These patents are incorporated herein by reference.

The electronically tunable materials that can be used in the present invention include at least one electronically tunable dielectric phase, such as barium strontium titanate, in combination with at least two additional metal oxide phases. Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.05 to about 0.4, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)$ $5KH_2PO_4$.

In addition, the following U.S. Patent Applications, assigned to the assignee of this application, disclose additional examples of tunable dielectric materials: U.S. application Ser. No. 09/594,837 filed Jun. 15, 2000, entitled "Electronically Tunable Ceramic Materials Including Tunable Dielectric and Metal Silicate Phases"; U.S. application Ser. No. 09/768,690 filed Jan. 24, 2001, entitled "Electronically Tunable, Low-Loss Ceramic Materials Including a Tunable Dielectric Phase and Multiple Metal Oxide Phases"; U.S. application Ser. No. 09/882,605 filed Jun. 15, 2001, entitled "Electronically Tunable Dielectric Composite Thick Films And Methods Of Making Same"; and U.S. Provisional Application Ser. No. 60/295,046 filed Jun. 1, 2001 entitled "Tunable Dielectric Compositions Including Low Loss Glass Frits". These patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

Thick films of tunable dielectric composites can comprise $Ba_{1-x}Sr_xTiO_3$, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components or two or more of these components in quantities from 0.25 weight percent to 80 weight percent with BSTO weight ratios of 99.75 weight percent to 20 weight percent.

The electronically tunable materials can also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include $Mg_2SiO_4$, $CaSiO_3$, $BaSiO_3$ and $SrSiO_3$. In addition to Group 2A metals, the present metal silicates may include metals from Group 1A, i.e., Li, Na, K, Rb, Cs and Fr, preferably Li, Na and K. For example, such metal silicates may include sodium silicates such as $Na_2SiO_3$ and $NaSiO_3$-$5H_2O$, and lithium-containing silicates such as $LiAlSiO_4$, $Li_2SiO_3$ and $Li_4SiO_4$. Metals from Groups 3A, 4A and some transition metals of the Periodic Table may also be suitable constituents of the metal silicate phase. Additional metal silicates may include $Al_2Si_2O_7$, $ZrSiO_4$, $KalSi_3O_8$, $NaAlSi_3O_8$, $CaAl_2Si_2O_8$, $CaMgSi_2O_6$, $BaTiSi_3O_9$ and $Zn_2SiO_4$. Tunable dielectric materials identified as Parascan™ materials, are available from Paratek Microwave, Inc. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include $Mg_2SiO_4$, MgO, $CaTiO_3$, $MgZrSrTiO_6$, $MgTiO_3$, $MgAl_2O_4$, $WO_3$, $SnTiO_4$, $ZrTiO_4$, $CaSiO_3$, $CaSnO_3$, $CaWO_4$, $CaZrO_3$, $MgTa_2O_6$, $MgZrO_3$, $MnO_2$, PbO, $Bi_2O_3$, and $La_2O_3$. Particularly preferred additional metal oxides include $Mg_2SiO_4$, MgO, $CaTiO_3$, $MgZrSrTiO_6$, $MgTiO_3$, $MgAl_2O_4$, $MgTa_2O_6$ and $MgZrO_3$.

The additional metal oxide phases may alternatively include at least two Mg-containing compounds. In addition to the multiple Mg-containing compounds, the material may optionally include Mg-free compounds, for example, oxides of metals selected from Si, Ca, Zr, Ti, Al and/or rare earths. In another embodiment, the additional metal oxide phases may include a single Mg-containing compound and at least one Mg-free compound, for example, oxides of metals selected from Si, Ca, Zr, Ti, Al and/or rare earths.

This invention provides minimal loss auto-adjusting matching circuits for application to microwave transmission line devices that utilize a bias voltage for tuning. Each embodiment of the auto-adjusting matching circuit is comprised of a microwave transmission line configuration, a tunable dielectric material, means for connecting to a bias voltage, and a non-tunable low-loss dielectric material. In operation, the auto-adjusting matching circuit is placed adjacent to the tunable microwave device in order to reduce the reflections from impedance mismatch.

The invention contemplates various dielectric materials, tunable dielectric materials, tunable liquid crystals, bias line geometries, matching stages, impedances of microstrip lines, and operating frequencies of the auto-adjusting matching circuit. It should be understood that the foregoing disclosure relates to only typical embodiments of the invention and that numerous modifications or alternatives may be made therein by those skilled in the art without departing from the scope of the invention as set forth in the appended claims.

What is claimed is:

1. An impedance matching circuit comprising:
    a conductor line having an input port and an output port;
    a ground conductor;
    a first microstrip stage comprising a tunable dielectric material positioned between a first section of said conductor line and said ground conductor;
    a second microstrip stage comprising a non-tunable dielectric material positioned between a second section of said conductor line and said ground conductor;
    a third microstrip stage comprising a tunable dielectric material positioned between a first section of said conductor line and said ground conductor, wherein said second microstrip stage is positioned between said first microstrip stage and said third microstrip stage; and
    an adjustable DC voltage source for applying a DC voltage between said conductor line and said ground conductor.

2. The impedance matching circuit of claim 1, wherein:
    the conductor line is a multi-step microstrip line; and
    the ground conductor comprises a ground plane.

3. The impedance matching circuit of claim 2, wherein:
    the first section of the multi-step microstrip line is deposited on said first microstrip stage;
    the second section of the multi-step microstrip line is deposited on said second microstrip stage; and
    the first and second sections of the multi-step microstrip line are connected in series to form a tunable microstrip impedance transformer.

4. The impedance matching circuit of claim 3, further comprising:
    multiple pairs of microstrip sections functionally interposed between said first section and said second section of said multi-step microstrip line;
    each pair of microstrip sections include a microstrip section on a tunable dielectric material which is connected in series with a microstrip section on a non-tunable dielectric material; and
    the pairs of microstrip sections together with said first and said second sections of the multi-step microstrip line are connected in series to form a cascaded network.

5. The impedance matching circuit of claim 1, wherein:
    the conductor line is a multi-step stripline; and
    the ground conductor is a first ground plane and a second ground plane.

6. The impedance matching circuit of claim 5, wherein:
    the first section of the multi-step stripline is deposited within said tunable dielectric material located between said first ground plane and said second ground plane;

the second section of the multi-step stripline is deposited within said non-tunable dielectric material located between said first ground plane and said second ground plane; and
    the first and second sections of the multi-step stripline are connected in series to form a tunable stripline impedance transformer.

7. The impedance matching circuit of claim 6, further comprising:
    multiple pairs of stripline functionally interposed between said first section and said second section of said multi-step stripline;
    each pair of stripline sections include a microstrip section deposited within a tunable dielectric material which is connected in series with a microstrip section deposited within a non-tunable dielectric material; and
    the pairs of stripline sections together with the said first and said second sections of the multi-step stripline are connected in series to form a cascaded network.

8. The impedance matching circuit of claim 1, wherein:
    the conductor line is a center conductor;
    the ground conductor is a cylindrical outer ground conductor; and
    the center conductor is coaxially aligned with said cylindrical outer ground conductor.

9. The impedance matching circuit of claim 8, wherein:
    the first section of the center conductor is imbedded in the tunable dielectric material;
    the second section of the center conductor is imbedded in the non-tunable dielectric material;
    the first and second sections of the center conductor are connected in series to form a tunable co-axial transmission line impedance transformer.

10. The impedance matching circuit of claim 9, further comprising:
    multiple pairs of center conductor sections functionally interposed between said first section and said second section of said center conductor;
    each pair of center conductor sections includes a conductor section in a tunable dielectric material which is connected in series with a conductor section in a non-tunable dielectric material;
    the pairs of center conductor sections together with the said first and said second sections of the center conductor are connected in series to form a cascaded network.

11. The impedance matching circuit of claim 1, wherein:
    the tunable dielectric material is a barium strontium titanate composite.

12. The impedance matching circuit of claim 1, wherein the tunable dielectric material includes a material selected from the group of:
    $Ba_xSr_{1-x}TiO_3$, $Ba_xCa_{1-x}TiO_3$, $Pb_xZr_{1-x}TiO_3$, lead lanthanum zirconium titanate, $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)5KH_2PO_4$.

13. The impedance matching circuit of claim 12, wherein the tunable dielectric material further includes a material selected from the following:
    $MgO$, $MgAl_2O_4$, $MgTiO_3$, $Mg_2SiO_4$, $MgZrO_3$, $CaSiO_3$, $MgSrZrTiO_6$, $CaTiO_3$, $Al_2O_3$, $SiO_2$, $BaSiO_3$, and $SrSiO_3$, and combinations thereof.

14. The impedance matching circuit of claim 12, wherein the tunable dielectric material further includes a material selected from the group of:

zirconnates, tannates, rare earths, niobates, tantalates, $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

15. The impedance matching circuit of claim 1, wherein said impedance matching circuit can maximize the power transfer from a microwave source to a tunable microwave device.

16. The impedance matching circuit of claim 15, wherein said tunable microwave device includes a tunable phase shifter, a tunable delay line or a tunable filter.

17. The impedance matching circuit of claim 15, wherein said tunable microwave device operates in a range from 500 MHz to 40 GHz.

18. The impedance matching circuit to claim 1, wherein said impedance matching circuit can maximize the power transfer to a microwave load from a tunable microwave device.

19. The impedance matching circuit of claim 18, wherein said tunable microwave device includes a tunable phase shifter, a tunable delay line or a tunable filter.

20. The impedance matching circuit of claim 18, wherein said tunable microwave device operates in a range from 500 MHz to 400 Hz.

21. The impedance matching circuit of claim 1, wherein said first microstrip stage is substantially longer than a quarter wavelength.

22. The impedance matching circuit of claim 1, wherein said first microstrip stage is substantially shorter than a quarter wavelength.

23. The impedance matching circuit of claim 1, wherein the tunable dielectric material comprises $Ba_xCa_{1-x}TiO_3$.

24. The impedance matching circuit of claim 1, wherein the tunable dielectric material comprises lead.

25. The impedance matching circuit of claim 1, wherein the tunable dielectric material comprises lanthanum.

26. The impedance matching circuit of claim 1, wherein the tunable dielectric material comprises niobium.

* * * * *